(12) United States Patent
Jo et al.

(10) Patent No.: US 11,663,968 B2
(45) Date of Patent: May 30, 2023

(54) DISPLAY DEVICE AND DRIVING METHOD THEREOF

(71) Applicant: Samsung Display Co., Ltd., Yongin-si (KR)

(72) Inventors: Ara Jo, Seoul (KR); Woo-Chul Kim, Seoul (KR); Inbok Song, Hwaseong-si (KR); Kanghee Lee, Yongin-si (KR); Deok Jun Choi, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/463,253

(22) Filed: Aug. 31, 2021

(65) Prior Publication Data
US 2022/0165211 A1 May 26, 2022

(30) Foreign Application Priority Data

Nov. 25, 2020 (KR) .................. 10-2020-0160336

(51) Int. Cl.
| | | |
|---|---|---|
| *G06F 3/041* | (2006.01) | |
| *G09G 3/3225* | (2016.01) | |
| *H01L 27/32* | (2006.01) | |
| *G06F 3/044* | (2006.01) | |

(52) U.S. Cl.
CPC .......... *G09G 3/3225* (2013.01); *G06F 3/0412* (2013.01); *G06F 3/0446* (2019.05); *H01L 27/323* (2013.01); *G09G 2330/028* (2013.01)

(58) Field of Classification Search
None
See application file for complete search history.

(56) References Cited

U.S. PATENT DOCUMENTS

| | | | |
|---|---|---|---|
| 9,229,599 B2 | 1/2016 | Lee et al. | |
| 10,217,396 B2 | 2/2019 | Huang et al. | |
| 10,599,264 B2 | 3/2020 | Park et al. | |
| 2010/0327959 A1 | 12/2010 | Lee | |
| 2018/0150184 A1* | 5/2018 | Kim | ........................ G06F 3/044 |

FOREIGN PATENT DOCUMENTS

| | | |
|---|---|---|
| KR | 1020100138146 A | 12/2010 |
| KR | 101315227 B1 | 10/2013 |
| KR | 1020170045436 A | 4/2017 |
| KR | 1020170098057 A | 8/2017 |

* cited by examiner

*Primary Examiner* — Brian M Butcher
(74) *Attorney, Agent, or Firm* — Cantor Colburn LLP

(57) ABSTRACT

A display device includes a display panel, an input sensor disposed on the display panel, a panel driving circuit which drives the display panel and generates a first driving voltage, and a readout circuit which controls the input sensor. The readout circuit receives the first driving voltage from the panel driving circuit and outputs transmit signals to control the input sensor.

18 Claims, 9 Drawing Sheets

DISPLAY DEVICE AND DRIVING METHOD THEREOF

This application claims priority to Korean Patent Application No. 10-2020-0160336 filed on Nov. 25, 2020, and all the benefits accruing therefrom under 35 U.S.C. § 119, the content of which in its entirety is herein incorporated by reference.

BACKGROUND

Embodiments of the present disclosure described herein relate to a display device.

Multimedia electronic devices such as a television, a mobile phone, a tablet PC, a computer, a navigation device, a game console, and the like include display devices for displaying an image. In addition to a general input method such as a button, a keyboard, a mouse, or the like, an electronic device may include a display device capable of providing a touch-based input method that allows a user to enter information or commands easily and intuitively.

As a portable electronic device such as a mobile phone is used widely, a display device capable of minimizing power consumption become desirable.

SUMMARY

Embodiments of the present disclosure provide a display device having reduced power consumption.

According to an embodiment, a display device includes a display panel, an input sensor disposed on the display panel, a panel driving circuit which drives the display panel and generates a first driving voltage, and a readout circuit which controls the input sensor. The readout circuit receives the first driving voltage from the panel driving circuit and outputs transmit signals to control the input sensor.

In an embodiment, the panel driving circuit may include a driving circuit which outputs a control signal and an image data signal to the display panel and a voltage generator which receives an input voltage and generates the first driving voltage and a second driving voltage, where the second driving voltage is used for an operation of the driving circuit.

In an embodiment, the readout circuit may include a sensor controller which outputs the transmit signals and a sensor voltage generator which receives the first driving voltage and generates a sensor voltage for an operation of the sensor controller.

In an embodiment, the first driving voltage may have a voltage level higher than an input voltage.

In an embodiment, the sensor voltage generator may include a charge pump which receives the first driving voltage and generates an output voltage having a voltage level higher than the first driving voltage, and a regulator which receives the output voltage of the charge pump and outputs the sensor voltage.

In an embodiment, the first driving voltage may be about 6 voltages (V), and the sensor voltage may be about 12 V.

In an embodiment, the regulator may be a low drop out ("LDO") regulator.

In an embodiment, the readout circuit may include a sensor controller which outputs the transmit signals based on the first driving voltage.

In an embodiment, the input sensor may be directly disposed on the display panel. The input sensor may include first sensing electrodes, second sensing electrodes crossing the first sensing electrodes, first signal lines connected to the first sensing electrodes, respectively, and second signal lines connected to the second sensing electrodes, respectively.

In an embodiment, the readout circuit may output the transmit signals to the first signal lines and may receive sensing signals from the second signal lines.

According to an embodiment, a display device includes a display layer, an input layer disposed on the display layer, a panel driving circuit electrically connected to the display layer, and a readout circuit electrically connected to the input layer. The panel driving circuit includes a voltage generator which receives an input voltage and generates a first driving voltage and a second driving voltage. The second driving voltage is to be provided to the display layer. The readout circuit receives the first driving voltage from the voltage generator and outputs transmit signals to be provided to the input layer.

In an embodiment, the panel driving circuit may further include a driving circuit which receives the second driving voltage and controls the display layer.

In an embodiment, the readout circuit may include a sensor voltage generator which receives the first driving voltage and generates a sensor voltage and a sensor controller receives the sensor voltage and outputs the transmit signals.

In an embodiment, the first driving voltage may have a voltage level higher than an input voltage.

In an embodiment, the sensor voltage generator may include a charge pump which receives the first driving voltage and generates an output voltage having a voltage level higher than the first driving voltage, and a regulator which receives the output voltage of the charge pump and outputs the sensor voltage.

In an embodiment, the first driving voltage may be about 6 V, and the sensor voltage may be about 12 V.

In an embodiment, the regulator may be an LDO regulator.

In an embodiment, the readout circuit may include a sensor controller which outputs the transmit signals based on the first driving voltage.

In an embodiment, the input layer may be directly disposed on the display layer. The input layer may include first sensing electrodes, second sensing electrodes crossing the first sensing electrodes, first signal lines connected to the first sensing electrodes, respectively, and second signal lines connected to the second sensing electrodes, respectively.

In an embodiment, the readout circuit may output the transmit signals to the first signal lines and may receive sensing signals from the second signal lines.

BRIEF DESCRIPTION OF THE FIGURES

The above and other features of the present disclosure will become apparent by describing in detail embodiments thereof with reference to the accompanying drawings.

DETAILED DESCRIPTION

Figure 1:
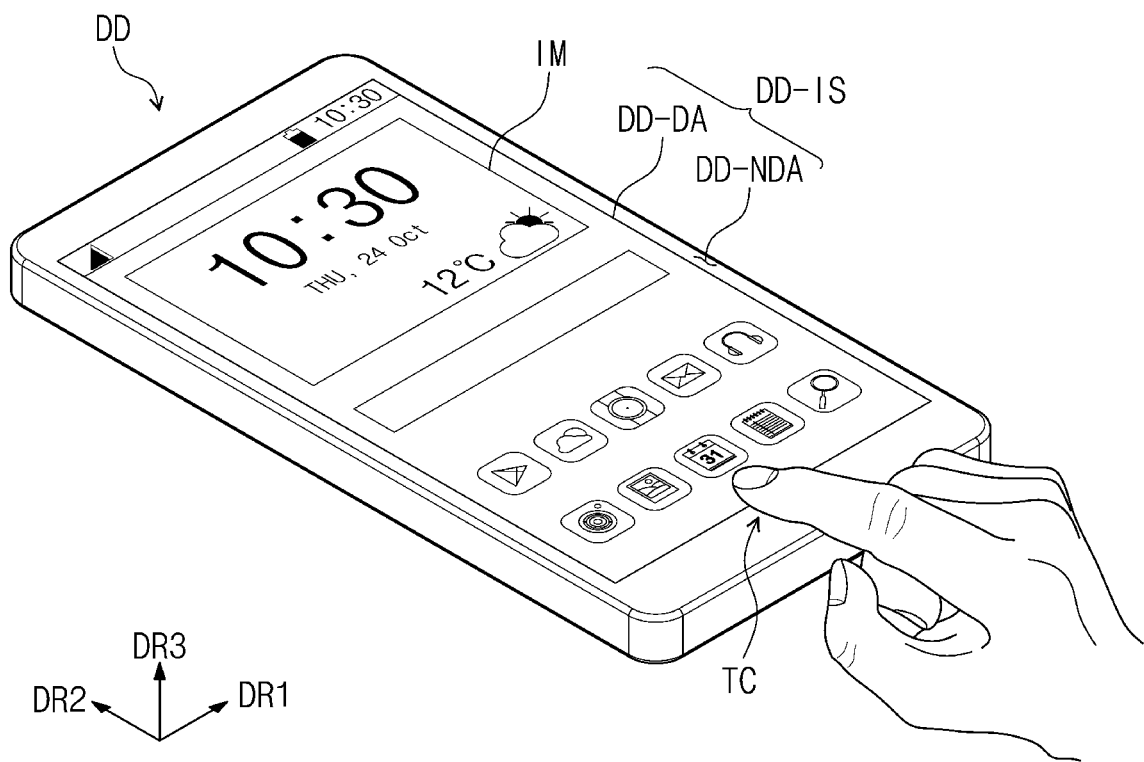
FIG. 1 is a perspective view of a display device according to an embodiment of the present disclosure.

In the specification, when one component (or area, layer, part, or the like) is referred to as being "on", "connected to", or "coupled to" another component, it should be understood that the former may be directly on, connected to, or coupled to the latter, and also may be on, connected to, or coupled to the latter via a third intervening component.

Like reference numerals refer to like components. Also, in drawings, the thickness, ratio, and dimension of components are exaggerated for effectiveness of description of technical contents. The term "and/or" includes one or more combinations of the associated listed items.

The terms "first", "second", etc. are used to describe various components, but the components are not limited by the terms. The terms are used only to differentiate one component from another component. For example, a first component may be named as a second component, and vice versa, without departing from the spirit or scope of the present disclosure. A singular form, unless otherwise stated, includes a plural form.

Also, the terms "under", "beneath", "on", "above", etc. are used to describe a relationship between components illustrated in a drawing. The terms are relative and are described with reference to a direction indicated in the drawing.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

Unless otherwise defined, all terms (including technical terms and scientific terms) used in this specification have the same meaning as commonly understood by those skilled in the art to which the present disclosure belongs. Furthermore, terms such as terms defined in commonly used dictionaries should be interpreted as having a meaning consistent with the meaning in the context of the related technology, and is explicitly defined herein unless interpreted in ideal or overly formal meanings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Hereinafter, embodiments of the present disclosure will be described with reference to accompanying drawings.

FIG. 1 is a perspective view of a display device DD according to an embodiment of the present disclosure.

As illustrated in FIG. 1, the display device DD may display an image IM through a display surface DD-IS. The display surface DD-IS is parallel to a surface defined by a first direction axis DR1 and a second direction axis DR2. A normal direction of the display surface DD-IS, that is, a thicknesses direction of the display device DD corresponds to a third direction axis DR3.

A front surface (i.e., an upper surface) and a back surface (i.e., a lower surface) of each part or member described later are divided by the third direction axis DR3. However, the first to third direction axes DR1, DR2, and DR3 illustrated in an embodiment are only examples. Hereinafter, first to third directions are defined as directions indicated by the first, second, and third direction axes DR1, DR2, and DR3, respectively. The first to third directions are marked by the same reference symbols.

The display device DD including, but is not limited to, a flat display surface is illustrated in an embodiment of the present disclosure. The display device DD may further include a curved display surface in another embodiment. The display device DD may include a three-dimensional ("3D") display surface. The 3D display surface may include a plurality of display areas facing in different directions, respectively. For example, the 3D display surface may include a polygonal columnar display surface.

The display device DD according to an embodiment of the present disclosure may be, but is not limited to, a rigid display device. For example, the display device DD according to an embodiment of the present disclosure may be a flexible display device. The flexible display device may include a foldable display device, a bending-type display device where a partial area is bent, or a slidable display device.

In an embodiment, FIG. 1 illustrates the display device DD that is applicable to a mobile phone terminal. Although not illustrated in FIG. 1, the mobile phone terminal may be implemented by arranging electronic modules, a camera module, a power module, and the like, which are mounted on a main board, in a bracket/case together with the display device DD. According to an embodiment of the present disclosure, the display device DD may be applied to a small and medium-sized electronic device, such as a tablet PC, a vehicle navigation system, a game console, a smart watch, or the like as well as a large-sized electronic device, such as a television, a monitor, or the like.

As illustrated in FIG. 1, the display surface DD-IS includes an image area DD-DA, in which the image IM is displayed, and a bezel area DD-NDA adjacent to the image area DD-DA. The bezel area DD-NDA refers to an area where an image is not displayed. FIG. 1 illustrates a clock and icon images as an example of the image IM.

As illustrated in FIG. 1, the image area DD-DA may have a substantially-rectangular shape. The "substantially-rectangular shape" includes not only a rectangular shape defined mathematically but also a rectangular shape in which a boundary of a curve is defined without defining a vertex in a vertex area (or a corner area).

The bezel area DD-NDA may surround the image area DD-DA, but is not limited thereto. For example, the image area DD-DA and the bezel area DD-NDA may be designed in different shapes. The bezel area DD-NDA may be disposed on only one side of the image area DD-DA in another embodiment. The bezel area DD-NDA may not be exposed to the outside depending on a combination of the display device DD and another component of an electronic device (not illustrated).

The display device DD according to an embodiment of the present disclosure may detect an externally-applied user input TC. The user input TC may be applied by using one of various external inputs such as a part of a user's body, an instrument such as a stylus pen, and the like, or a combination thereof. The display device DD may detect the user input TC by detecting a change in one of reflection light, temperature, pressure, ultrasonic wave, or electromagnetic field, or a combination thereof in response to the user input TC. In an embodiment, it is assumed that the user input TC is a touch input by a user's hand applied to a front surface of the display device DD, but an input scheme of the user input TC is an example. As described above, the user input TC may be provided in various input schemes. Besides, the display device DD may detect the user input TC applied to a side surface or a bottom surface of the display device DD depending on a structure of the display device DD, and this scheme may not be limited to one embodiment.

Figure 2:
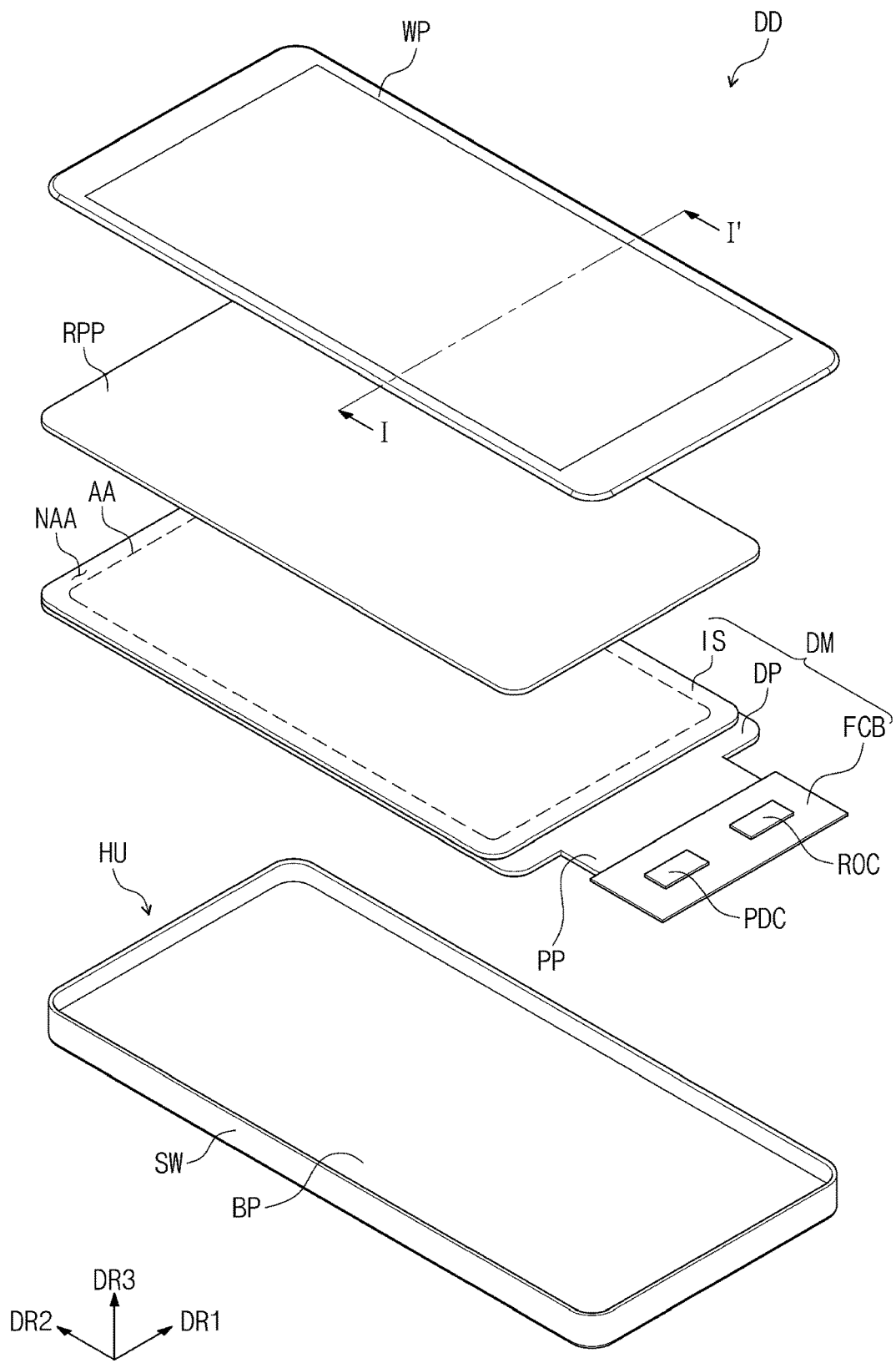
FIG. 2 is an exploded perspective view of a display device according to an embodiment of the present disclosure.

FIG. 2 is an exploded perspective view of a display device according to an embodiment of the present disclosure.

Referring to FIG. 2, the display device DD may include a window WP, an anti-reflection panel (anti-reflector) RPP, a display module DM, and housing HU. As illustrated in FIGS. 1 and 2, in an embodiment, an appearance of the display device DD may be formed by coupling the window WP and the housing HU.

The window WP protects an upper surface of a display panel DP. The window WP may include an optically transparent insulating material. For example, the window WP may include glass or plastic. The window WP may have a multi-layer structure or a single-layer structure. For example, the window WP may include a plurality of plastic films bonded through an adhesive or may include a glass substrate and a plastic film that are bonded through an adhesive.

The anti-reflection panel RPP may be disposed under the window WP.

The anti-reflection panel RPP reduces a reflectance of external light incident from an upper surface of the window WP. In an embodiment of the present disclosure, the anti-reflection panel RPP may be omitted or may be embedded in the display module DM.

The display module DM may display the image IM and may detect an external input (e.g., user input TC). The display module DM may include the display panel DP, an input sensor IS, and a printed circuit board FCB.

An active area AA corresponding to the image area DD-DA illustrated in FIG. 1 and a peripheral area NAA corresponding to the bezel area DD-NDA illustrated in FIG. 1 may be defined in the display panel DP. The display panel DP may be a configuration that substantially generates the image IM (refer to FIG. 1). The image IM generated in the active area AA of the display panel DP is visibly perceived by a user from the outside through the window WP.

The input sensor IS detects the external input applied from the outside. As described above, the input sensor IS may detect an external input provided to the window WP.

The display panel DP may include a pad area PP. A plurality of signal pads DP-PD and IS-PD (refer to FIG. 5) may be disposed in the pad area PP of the display panel DP. The display panel DP may be electrically connected to the printed circuit board FCB through pads. In an embodiment, a driving chip that generates signals for an operation of the display panel DP may be mounted in the pad area PP.

The printed circuit board FCB may include various driving circuits that drive the display panel DP and the input sensor IS, a connector for power supply, or the like. In an embodiment, the printed circuit board FCB may include a panel driving circuit PDC that drives the display panel DP, and a readout circuit ROC that drives the input sensor IS.

The panel driving circuit PDC may be electrically connected to the display panel DP to control the display panel DP. The readout circuit ROC may be electrically connected to the input sensor IS to control the input sensor IS.

Each of the panel driving circuit PDC and the readout circuit ROC may be formed as an integrated circuit and may be mounted on the printed circuit board FCB. In an embodiment, the panel driving circuit PDC and the readout circuit ROC may be integrated with one integrated circuit. The panel driving circuit PDC may be referred to as a "driving controller", a "timing controller", a "main controller", or the like. The readout circuit ROC may be variously referred to as an "input driving circuit", a "sensor driving circuit", and a "touch driving circuit".

The housing HU includes a bottom part BP and a side wall SW. The side wall SW may be extended from the bottom part BP. The housing HU may accommodate the display panel DP in the accommodation space defined by the bottom part BP and the side wall SW. The window WP may be coupled with the side wall SW of the housing HU. The side wall SW of the housing HU may support an outer portion of the window WP.

The housing HU may include a material having relatively high rigidity. For example, the housing HU may include glass, plastic, or metal or may include a plurality of frames and/or a plurality of plates composed of a combination thereof. The housing HU may stably protect components of the display device DD accommodated in an inner space from an external impact.

Figure 3:
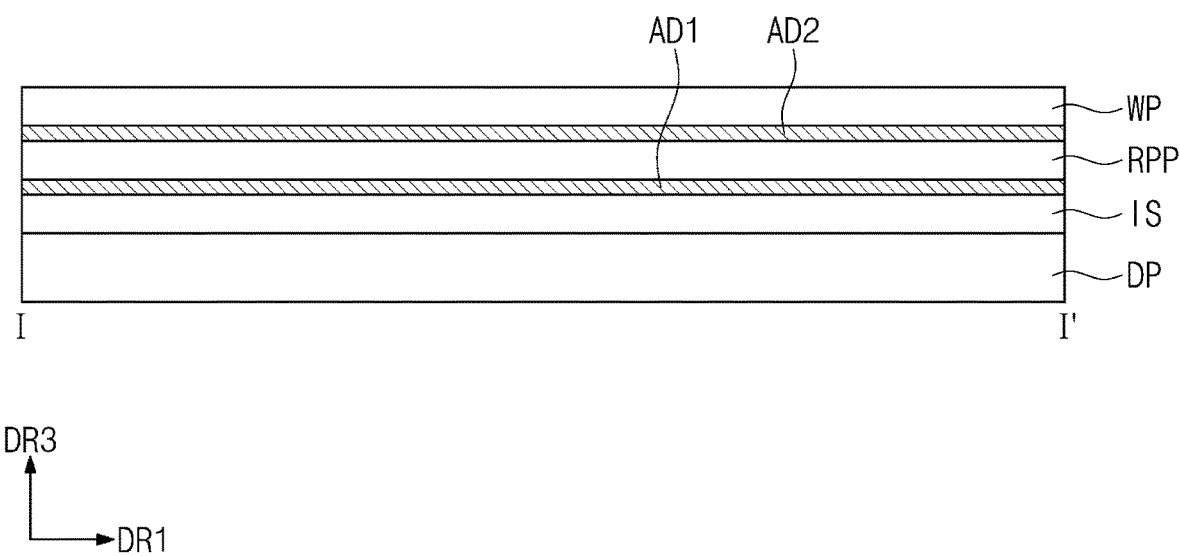
FIG. 3 is a cross-sectional view of a display device taken along line I-I' illustrated in FIG. 2.

FIG. 3 is a cross-sectional view of a display device taken along line I-I' illustrated in FIG. 2.

FIG. 3 illustrates a cross section of the display device DD defined by the first direction axis DR1 and the third direction axis DR3. FIG. 3 illustrates components of the display device DD simply to explain a relationship in which the components are stacked.

According to an embodiment of the present disclosure, the display device DD may include the display panel DP, the input sensor IS, the anti-reflection panel RPP, and the window WP. At least part of components among the display panel DP, the input sensor IS, the anti-reflection panel RPP, and the window WP may be formed in continuous processes. Alternatively, at least part of the components thereof may be coupled with one another by an adhesive member. In an embodiment, the input sensor IS and the anti-reflection panel RPP may be coupled with each other by an adhesive member AD1. The anti-reflection panel RPP and the window WP may be coupled with each other by an adhesive member AD2.

Each of the adhesive members AD1 and AD2 may refer to a transparent adhesive member such as a pressure sensitive adhesive ("PSA") film, an optically clear adhesive ("OCA") film, or an optically clear resin ("OCR"). An adhesive member described later may include a general adhesive or a pressure sensitive adhesive. In an embodiment of the present disclosure, the anti-reflection panel RPP and the window WP may be replaced with other components or may be omitted.

In FIG. 3, the input sensor IS, which is formed through continuous processes together with the display panel DP, from among the input sensor IS, the anti-reflection panel RPP, and the window WP is directly disposed on the display panel DP. In this specification, "component B is directly disposed on component A" means that a separate adhesive layer/adhesive member is not interposed between component A and component B. Component B is formed on a base surface, which is provided by component A after component A is formed, through continuous processes.

In an embodiment, each of the anti-reflection panel RPP and the window WP has a "panel" type, and the input sensor IS has a "layer" type. A component of the "panel" type includes a base layer providing a base surface, such as a synthetic resin film, a composite film, a glass substrate, or the like. However, the base layer may be omitted in a component of the "layer" type. In other words, components of the "layer" type are disposed on the base surface provided by another component. In an embodiment of the present disclosure, the anti-reflection panel RPP and the window WP may have the "layer" type. In an embodiment, the display panel DP may have the "layer" type. In other words, the display panel DP may be referred to as a "display layer", and the input sensor IS may be referred to as a "input layer".

The display panel DP generates an image, and the input sensor IS obtains coordinate information of an external input (e.g., a touch event). Although not separately illustrated in FIG. 3, the display device DD according to an embodiment of the present disclosure may further include a protective member disposed on a lower surface (or a bottom surface) of the display panel DP. The protective member and the display panel DP may be bonded through an adhesive member.

The display panel DP according to an embodiment of the present disclosure may be, but is not particularly limited to, a light emitting display panel. In an embodiment, the display panel DP may be an organic light emitting display panel or a quantum dot light emitting display panel. The panels are distinguished depending on a material of a light emitting element. A light emitting layer of the organic light emitting display panel may include an organic light emitting material. A light emitting layer of the quantum dot light emitting display panel may include a quantum dot and/or a quantum rod. Hereinafter, it is described that the display panel DP is an organic light emitting display panel.

The anti-reflection panel RPP reduces a reflectance of external light incident from an upper surface of the window WP. The anti-reflection panel RPP according to an embodiment of the present disclosure may include a retarder and a polarizer. The retarder may have a film type or a liquid crystal coating type. The polarizer may also have a film type or liquid crystal coating type. A panel of the film type may include a stretched synthetic resin film, and a panel of the liquid crystal coating type may include liquid crystals arranged in a predetermined array. Each of the retarder and the polarizer may further include a protective film. The retarder and polarizer themselves may be defined as a base layer of the anti-reflection panel RPP. Alternatively, the protective film may be defined as the base layer of the anti-reflection panel RPP.

The anti-reflection panel RPP according to an embodiment of the present disclosure may include color filters. The color filters have a predetermined array. An array of color filters may be determined in consideration of light emitting colors of pixels included in the display panel DP. The anti-reflection panel RPP may further include a black matrix adjacent to the color filters.

The anti-reflection panel RPP according to an embodiment of the present disclosure may include a destructive interference structure. In an embodiment, the destructive interference structure may include a first reflective layer and a second reflective layer, which are disposed on different layers from each other. First reflected light and second reflected light, which are reflected from the first reflective layer and the second reflective layer, respectively, may destructively interfere with each other, thereby reducing the reflectance of external light.

The window WP according to an embodiment of the present disclosure may include a glass substrate and/or a synthetic resin film. The window WP is not limited to a single layer. The window WP may include two or more films that are bonded with one another through an adhesive member. Although not separately illustrated in FIG. 3, the window WP may further include a functional coating layer. The functional coating layer may include an anti-fingerprint layer, an anti-reflection layer, a hard coating layer, and the like.

The input sensor IS and the display panel DP will be described in detail later.

Figure 4:
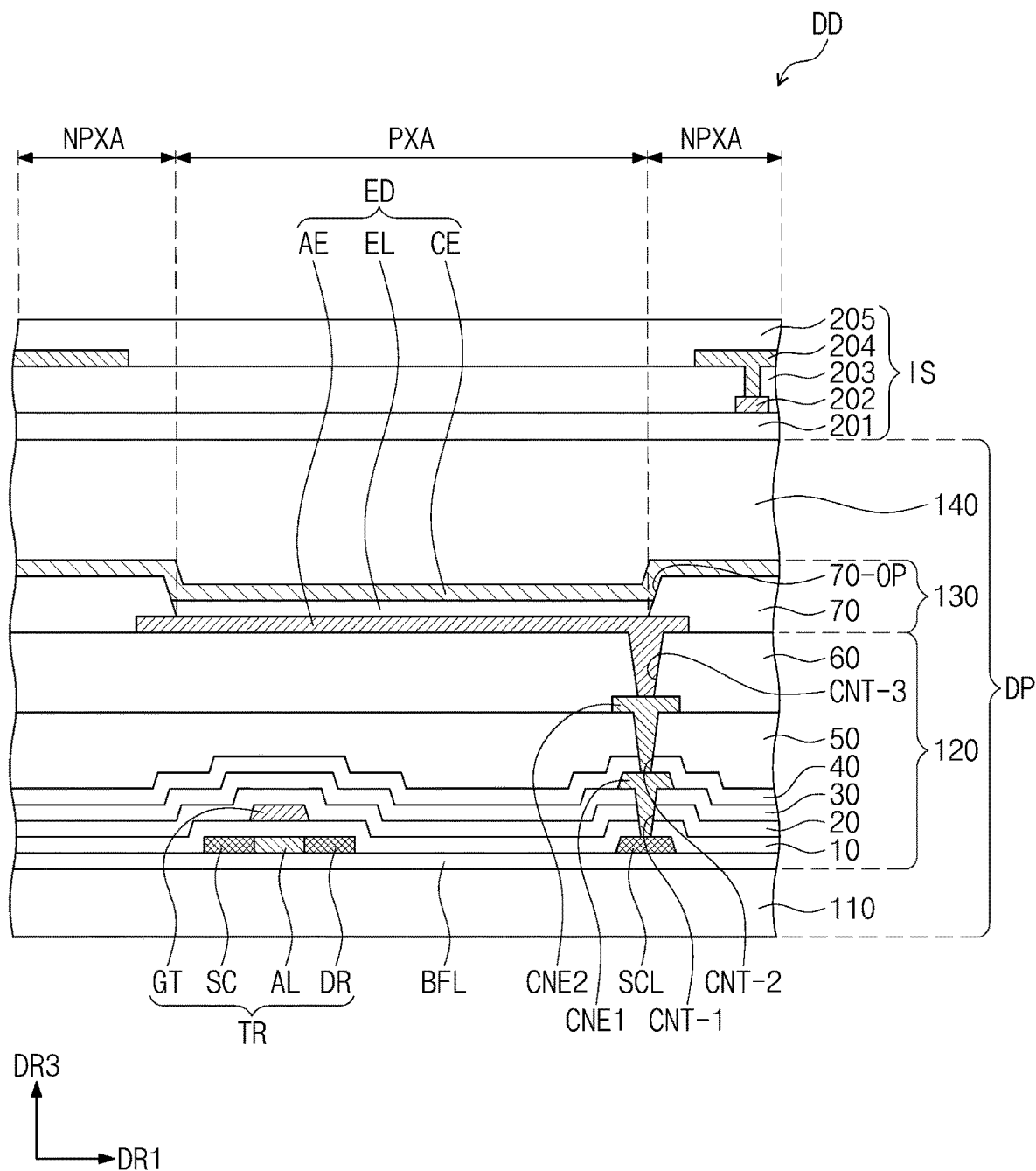
FIG. 4 is a cross-sectional view of a display device according to an embodiment of the present disclosure.

FIG. 4 is a cross-sectional view of the display device DD according to an embodiment of the present disclosure.

Referring to FIG. 4, the display panel DP includes a base layer 110. At least one inorganic layer is disposed on an upper surface of the base layer 110. The inorganic layer may include at least one of aluminum oxide, titanium oxide, silicon oxide, silicon nitride, silicon oxynitride, zirconium oxide, and hafnium oxide. The inorganic layer may be formed in multi-layers. The multi-layered inorganic layers may constitute a barrier layer and/or a buffer layer. In an embodiment, it is illustrated that the display panel DP includes a buffer layer BFL.

The buffer layer BFL may improve the bonding strength between the base layer 110 and a semiconductor pattern. The buffer layer BFL may include at least one of silicon oxide, silicon nitride, and silicon oxynitride. In an embodiment, the buffer layer BFL may include a structure in which a silicon oxide layer and a silicon nitride layer are stacked alternately.

The semiconductor pattern may be disposed on the buffer layer BFL. The semiconductor pattern may include, but is not limited to, polysilicon. For example, the semiconductor pattern may include amorphous silicon, low-temperature polycrystalline silicon, or an oxide semiconductor.

FIG. 4 only illustrates a part of the semiconductor pattern, and the semiconductor pattern may be further disposed in another area. The semiconductor pattern may be arranged in a specific rule throughout pixels. The semiconductor pattern may have an electrical characteristic that is different depending on whether the semiconductor pattern is doped. The semiconductor pattern may include a first area having high conductivity and a second area having low conductivity. The first area may be doped with an N-type dopant or a P-type dopant. A P-type transistor may include a doping area doped with the P-type dopant, and an N-type transistor may include a doping area doped with the N-type dopant. The second area may be a non-doping area or may be an area doped with a concentration lower than a concentration of the N-type dopant or the P-type dopant in the first area.

A conductivity of the first area is greater than a conductivity of the second area. The first area may substantially operate as an electrode or a signal line. The second area may substantially correspond to an active area (or a channel) of a transistor. In other words, a part of the semiconductor pattern may be an active area of the transistor. Another part thereof may be a source or drain of the transistor. Another part may be a connection electrode or a connection signal line.

Figure 5:
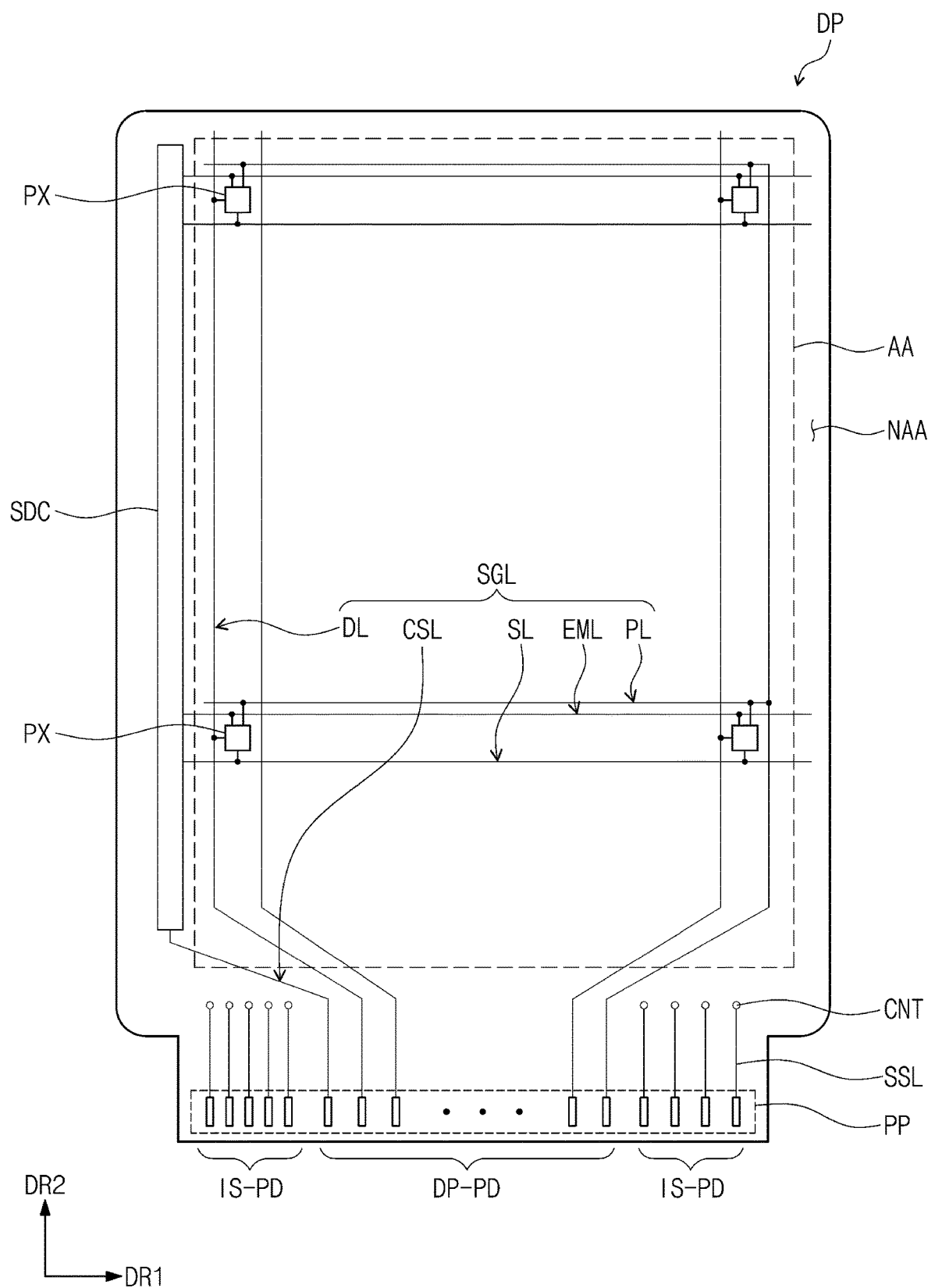
FIG. 5 is a plan view of a display panel according to an embodiment of the present disclosure.

The display panel DP may include a plurality of pixels PX (refer to FIG. 5). In an embodiment, each of the pixels PX may include a plurality of transistors, a capacitor, and a light emitting element. FIG. 4 illustrates only one transistor TR among a plurality of transistors and a light emitting element ED included in each of the pixels PX.

A source SC, an active area AL, and a drain DR of the transistor TR may be formed by using a semiconductor pattern. The source SC and the drain DR may be extended in directions opposite to each other from the active area AL on a cross section. A part of a connection signal wire SCL formed by using the semiconductor pattern is illustrated in FIG. 4. Although not separately illustrated in FIG. 4, the connection signal wire SCL may be electrically connected to the drain DR of the transistor TR in a plane view.

A first insulating layer 10 may be disposed on the buffer layer BFL. The first insulating layer 10 may overlap a plurality of pixels in common and may cover the semiconductor pattern in a plan view. The first insulating layer 10 may be an inorganic layer and/or an organic layer, and may have a single layer structure or a multi-layer structure. The first insulating layer 10 may include at least one of aluminum oxide, titanium oxide, silicon oxide, silicon nitride, silicon oxynitride, zirconium oxide, and hafnium oxide. In an embodiment, the first insulating layer 10 may be a single-layered silicon oxide layer. Not only the first insulating layer 10 but also an insulating layer of a circuit layer 120 to be described later may be an inorganic layer and/or an organic layer, and may have a single layer structure or a multi-layer structure. The inorganic layer may include at least one of the above-described materials, but is not limited thereto.

The gate GT of the transistor TR is disposed on the first insulating layer 10. The gate GT may be a part of a metal pattern. The gate GT vertically overlaps the active area AL. In a process of doping the semiconductor pattern, the gate GT may function as a mask.

A second insulating layer 20 is disposed on the first insulating layer 10 and may cover the gate GT. The second insulating layer 20 may overlap pixels in common in a plan view. The second insulating layer 20 may be an inorganic layer and/or an organic layer, and may have a single layer structure or a multi-layer structure. The second insulating layer 20 may include at least one of silicon oxide, silicon nitride, and silicon oxynitride. In an embodiment, the second insulating layer 20 may have a multi-layer structure including a silicon oxide layer and a silicon nitride layer.

A third insulating layer 30 may be disposed on the second insulating layer 20. The third insulating layer 30 may have a single layer structure or a multi-layer structure. In an embodiment, the third insulating layer 30 may have a multi-layer structure including a silicon oxide layer and a silicon nitride layer.

A first connection electrode CNE1 may be disposed on the third insulating layer 30. The first connection electrode CNE1 may be connected to the connection signal wire SCL through a contact hole CNT-1 penetrating the first, second, and third insulating layers 10, 20, and 30.

A fourth insulating layer 40 may be disposed on the third insulating layer 30. The fourth insulating layer 40 may be a silicon oxide layer having a single layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a contact hole CNT-2 penetrating the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer.

A light emitting element layer 130 may be disposed on the circuit layer 120. The light emitting element layer 130 may include the light emitting element ED. In an embodiment, the light emitting element layer 130 may include an organic light emitting material, a quantum dot, a micro-LED, or a nano-LED. Hereinafter, it is described that the light emitting element ED is an organic light emitting element, but is not particularly limited thereto.

The light emitting element ED may include a first electrode AE, a light emitting layer EL, and a second electrode CE.

The first electrode AE may be disposed on the sixth insulating layer 60. The first electrode AE may be connected to the second connection electrode CNE2 through a contact hole CNT-3 penetrating the sixth insulating layer 60.

A pixel defining film 70 may be disposed on the sixth insulating layer 60 and may cover a part of the first electrode AE. An opening 70-OP is defined in the pixel defining film 70. The opening 70-OP of the pixel defining film 70 exposes at least part of the first electrode AE.

The active area AA illustrated in FIG. 2 may include a light emitting area PXA and a non-light emitting area NPXA adjacent to the light emitting area PXA. The non-light emitting area NPXA may surround the light emitting area PXA. In an embodiment, the light emitting area PXA is defined to correspond to a partial area of the first electrode AE exposed by the opening 70-OP.

The light emitting layer EL may be disposed on the first electrode AE. The light emitting layer EL may be disposed in an area corresponding to the opening 70-OP. That is, the light emitting layer EL may be disposed separately in each of pixels. When the light emitting layer EL is disposed separately in each of the pixels, each of the light emitting layers EL may emit light of at least one color of blue, red, and green. However, the present disclosure is not limited thereto, and the light emitting layer EL may be connected and may be provided to each of the pixels in common. In this case, the light emitting layer EL may provide blue light or white light.

The second electrode CE may be disposed on the light emitting layer EL. The second electrode CE may be integrally disposed in a plurality of pixels in common.

Although not illustrated in FIG. 4, a hole control layer may be interposed between the first electrode AE and the light emitting layer EL. The hole control layer may be disposed in the light emitting area PXA and the non-light emitting area NPXA in common. The hole control layer may include a hole transport layer and may further include a hole injection layer. An electron control layer may be interposed between the light emitting layer EL and the second electrode CE. The electron control layer may include an electron transport layer, and may further include an electron injection layer. The hole control layer and the electron control layer may be disposed in common in a plurality of pixels, using an open mask.

An encapsulation layer 140 may be disposed on the light emitting element layer 130. The encapsulation layer 140 may include an inorganic layer, an organic layer, and an inorganic layer, which are sequentially stacked, but layers constituting the encapsulation layer 140 are not limited thereto.

The inorganic layers may protect the light emitting element layer 130 from moisture and oxygen; the organic layer may protect the light emitting element layer 130 from foreign objects such as dust particles. The inorganic layers may include a silicon nitride layer, a silicon oxynitride layer, a silicon oxide layer, a titanium oxide layer, an aluminum oxide layer, or the like. The organic layer may include, but is not limited to, an acrylic-based organic layer.

The input sensor IS may include a base layer 201, a first conductive layer 202, a detection insulating layer 203, a second conductive layer 204, and a cover insulating layer 205.

The base layer 201 may be an inorganic layer including at least one of silicon nitride, silicon oxynitride, and silicon oxide. Alternatively, the base layer 201 may be an organic layer including an epoxy resin, an acrylic resin, or an imide-based resin. The base layer 201 may have a single layer structure or may have a multi-layer structure stacked in the third direction DR3.

Each of the first conductive layer 202 and the second conductive layer 204 may have a single layer structure or may have a multi-layer structure stacked in the third direction DR3.

A conductive layer of a single layer structure may include a metal layer or a transparent conductive layer. The metal layer may include molybdenum, silver, titanium, copper, aluminum, or an alloy thereof. The transparent conductive layer may include a transparent conductive oxide such as indium tin oxide ("ITO"), indium zinc oxide ("IZO"), zinc oxide (ZnO), indium zinc tin oxide ("IZTO"), or the like. Besides, the transparent conductive layer may include a conductive polymer such as PEDOT, a metal nano wire, graphene, and the like.

A conductive layer of the multi-layer structure may include metal layers. In an embodiment, the metal layers may have a three-layer structure of titanium/aluminum/titanium. The conductive layer of the multi-layer structure may include at least one metal layer and at least one transparent conductive layer.

At least one of the detection insulating layer 203 and the cover insulating layer 205 may include an inorganic film. The inorganic film may include at least one of aluminum oxide, titanium oxide, silicon oxide, silicon nitride, silicon oxynitride, zirconium oxide, and hafnium oxide.

At least one of the detection insulating layer 203 and the cover insulating layer 205 may include an organic layer. The organic film may include at least one of acrylic-based resin, methacrylate-based resin, polyisoprene-based resin, vinyl-based resin, epoxy-based resin, urethane-based resin, cellulose-based resin, siloxane-based resin, polyimide-based resin, polyamide-based resin, and perylene-based resin.

FIG. 5 is a plan view of the display panel DP according to an embodiment of the present disclosure.

As illustrated in FIG. 5, the display panel DP may include a scan driving circuit SDC, a plurality of signal lines SGL (hereinafter referred to as "signal lines"), the plurality of signal pads DP-PD and IS-PD (hereinafter referred to as "signal pads"), and a plurality of pixels PX (hereinafter referred to as "pixels").

The scan driving circuit SDC generates a plurality of scan signals (hereinafter referred to as "scan signals") and sequentially outputs the scan signals to a plurality of scan lines SL (hereinafter referred to as "scan lines") described later. The scan driving circuit SDC may output not only the scan signals but also other control signals to the pixels PX.

The scan driving circuit SDC may include a plurality of transistors formed through the same process as a process in which transistors in the pixels PX are formed.

The signal lines SGL may include the scan lines SL, data lines DL, a power supply line PL, light emitting control lines EML, and a control signal line CSL. Each of the scan lines SL is connected to a corresponding pixel PX among the pixels PX; each of the data lines DL is connected to a corresponding pixel PX among the pixels PX; and, each of the light emitting control lines EML is connected to a corresponding pixel PX among the pixels PX. The power supply line PL is connected in common with the pixels PX. The control signal line CSL may provide control signals to the scan driving circuit SDC. The power supply line PL may provide a voltage for operations of the pixels PX. The power supply line PL may include a plurality of lines that provide different voltages from one another.

In an embodiment, the signal lines SGL may further include auxiliary lines SSL. Each of the auxiliary lines SSL refers to a signal line electrically connected to the input sensor IS (refer to FIG. 6). In an embodiment of the present disclosure, the auxiliary lines SSL may be omitted. The auxiliary lines SSL are connected to contact holes CNT, respectively. The auxiliary lines SSL may be electrically connected to signal lines of the input sensor IS (refer to FIG. 6) described later through the contact holes CNT.

The signal pads DP-PD and the signal pads IS-PD may include first-type signal pads DP-PD connected to the data lines DL, the power supply line PL, and the control signal line CSL and second-type signal pads IS-PD connected to the auxiliary lines SSL. The first-type signal pads DP-PD and the second-type signal pads IS-PD are disposed adjacent to each other in the pad area PP defined in a partial area of the peripheral area NAA. A stacked structure of the signal pads DP-PD is not distinguished from a stacked structure of the signal pads IS-PD, and, structure materials of the signal pads DP-PD are not distinguished from structure materials of the signal pads IS-PD. The signal pads DP-PD and the signal pads IS-PD may be formed through the same process as each other.

The active area AA may be defined as an area in which the pixels PX are disposed. A plurality of electronic elements are disposed in the active area AA. The electronic elements include an organic light emitting diode included in each of the pixels PX and a pixel driving circuit connected to the organic light emitting diode.

Although not illustrated in FIG. 5, each of the pixels PX may include a plurality of transistors, a capacitor, and an organic light emitting diode. The pixels PX are electrically connected to the scan lines SL, the data lines DL, the light emitting control lines EML, and the power supply line PL and radiate light in response to signals received through the scan lines SL, the data lines DL, the light emitting control lines EML, and the power supply line PL.

The signal pads DP-PD and IS-PD of the display panel DP may be electrically connected to the printed circuit board FCB illustrated in FIG. 2.

A part of the display panel DP illustrated in FIG. 5 may be bent. A part of the peripheral area NAA of the display panel DP may be bent and may be bent around a bending axis parallel to the first direction DR1. The bending axis may be defined to overlap a part of the control signal line CSL, a part of the data lines DL, and a part of the auxiliary lines SSL in a plan view.

Figure 6:
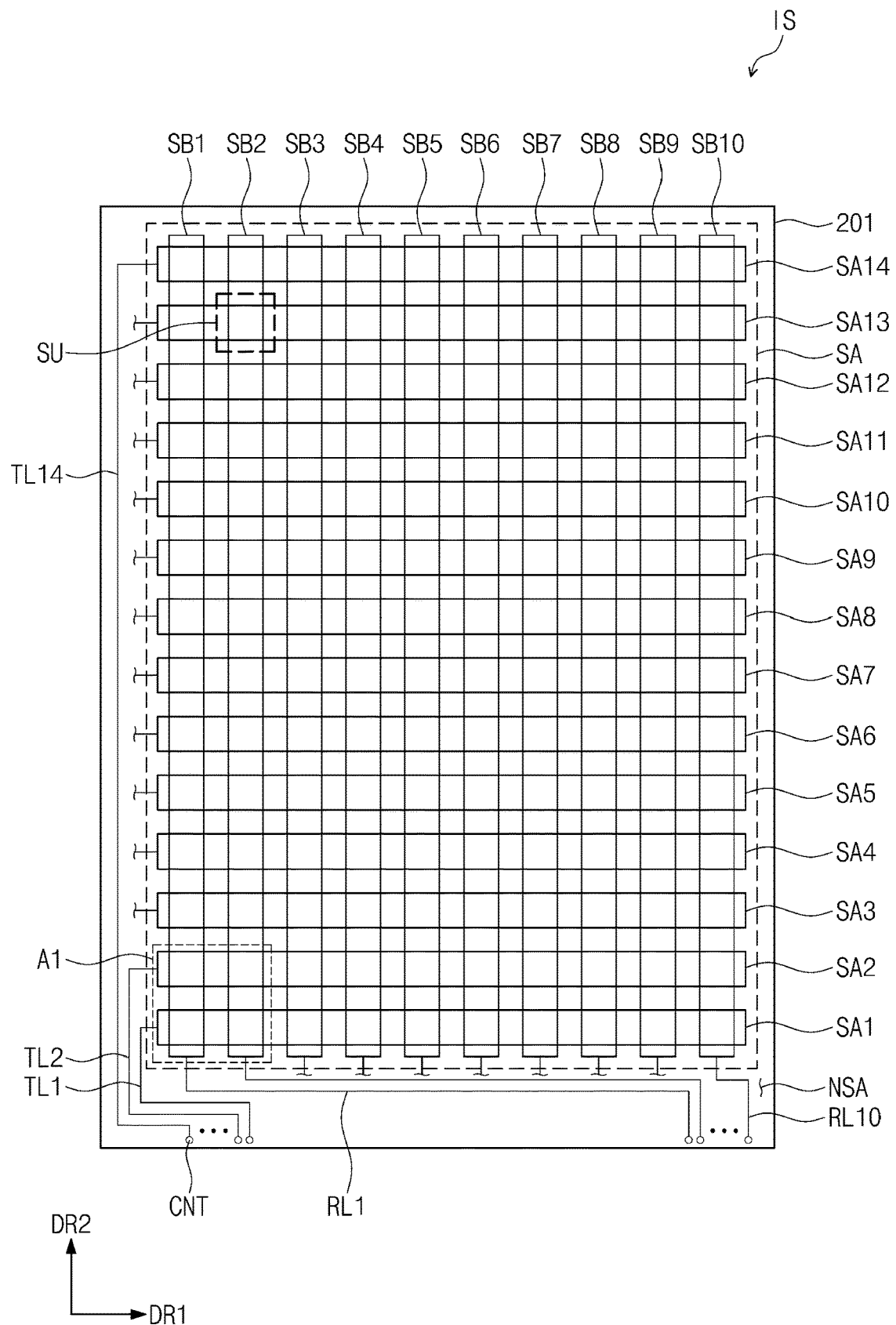
FIG. 6 is a plan view of an input sensor according to an embodiment of the present disclosure.

FIG. 6 is a plan view of the input sensor IS according to an embodiment of the present disclosure.

Referring to FIG. 6, the input sensor IS may include a sensing area SA and a non-sensing area NSA. The sensing area SA may be an area activated depending on an electrical signal. In an embodiment, the sensing area SA may be an area in which an input is sensed. The non-sensing area NSA may surround the sensing area SA. The sensing area SA may correspond to the active area AA of FIG. 5, and the non-sensing area NSA may correspond to the peripheral area NAA of FIG. 5.

The input sensor IS may include first sensing electrodes SA1 to SA14 and second sensing electrodes SB1 to SB10 disposed on the base layer 201. The first sensing electrodes SA1 to SA14 and the second sensing electrodes SB1 to SB10 are disposed in the sensing area SA. Each of the first sensing electrodes SA1 to SA14 and each of the second sensing electrodes SB1 to SB10 are electrically insulated and intersected with each other within the sensing area SA. In this embodiment of the present disclosure, the input sensor IS includes the first sensing electrodes SA1 to SA14 and the second sensing electrodes SB1 to SB10, but the present disclosure according to the invention is not limited thereto. The number of first sensing electrodes and the number of second sensing electrodes may be variously changed. FIG. 6 illustrates that the number of first sensing electrodes is greater than the number of second sensing electrodes. However, in another embodiment, the number of second sensing electrodes may not be less than the number of first sensing electrodes.

The input sensor IS may obtain location information about an external input through a change in mutual capacitance between the first sensing electrodes SA1 to SA14 and the second sensing electrodes SB1 to SB10.

The input sensor IS may further include first to fourteenth transmission lines TL1 to TL14 and first to tenth reception lines RL1 to RL10. The first to fourteenth transmission lines TL1 to TL14 and the first to tenth reception lines RL1 to RL10 may be disposed in the non-sensing area NSA. The first to fourteenth transmission lines TL1 to TL14 are electrically connected to sides of the first sensing electrodes SA1 to SA14, respectively. The first to tenth reception lines RL1 to RL10 are electrically connected to sides of the second sensing electrodes SB1 to SB10, respectively. However, the present disclosure according to the invention is not limited thereto. In another embodiment of the present disclosure, the input sensor IS may further include reception lines electrically connected to the other sides of the second sensing electrodes SB1 to SB10, respectively.

Each of intersections of the first sensing electrodes SA1 to SA14 and the second sensing electrodes SB1 to SB10 may be defined as one sensing unit SU.

The first to fourteenth transmission lines TL1 to TL14 and the first to tenth reception lines RL1 to RL10 may be electrically connected to the auxiliary lines SSL illustrated in FIG. 5 through the contact hole CNT.

Figure 7:
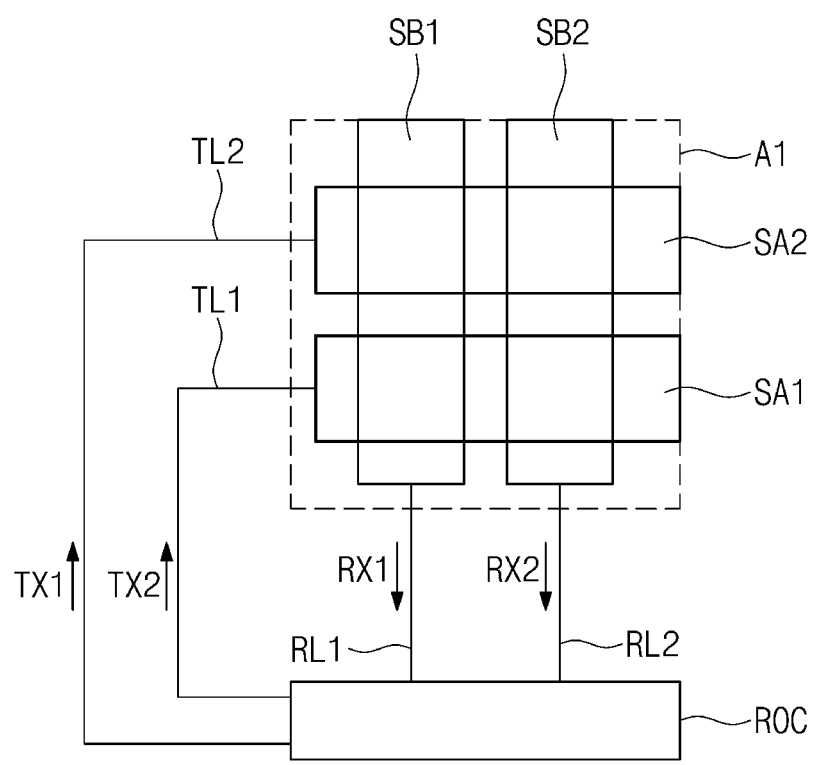
FIG. 7 is a diagram illustrating an operation of an input sensor.

FIG. 7 is a diagram illustrating an operation of an input sensor. FIG. 7 is an enlarged view of area µl in FIG. 6.

Referring to FIGS. 6 and 7, each of the first sensing electrodes SA1 to SA14 may operate as a transmission electrode. Each of the second sensing electrodes SB1 to SB10 may operate as a reception electrode. The readout circuit ROC may detect an external input by detecting an amount of change in mutual capacitance formed between the first sensing electrodes SA1 to SA14 and the second sensing electrodes SB1 to SB10.

For convenience of description, FIG. 7 illustrates only the first sensing electrodes SA1 and SA2 among the first sensing electrodes SA1 to SA14 illustrated in FIG. 6 and the second sensing electrodes SB1 and SB2 among the second sensing electrodes SB1 to SB10 illustrated in FIG. 6. The first sensing electrodes SA3 to SA14 illustrated in FIG. 6 and the second sensing electrodes SB3 to SB10 illustrated in FIG. 6 may also be driven in the same scheme as the first sensing electrodes SA1 and SA2 and the second sensing electrodes SB1 and SB2.

The readout circuit ROC may provide transmit signals TX1 and TX2 to the first sensing electrodes SA1 and SA2 through the transmission lines TL1 and TL2, respectively. The readout circuit ROC may receive sensing signals RX1 and RX2 from the second sensing electrodes SB1 and SB2 through the reception lines RL1 and RL2, respectively. Accordingly, a readout circuit ROC may compare the transmit signals TX1 and TX2 with the sensing signals RX1 and RX2 corresponding to the transmit signals TX1 and TX2, respectively, and may generate a coordinate value for a location, at which the user input TC (refer to FIG. 1) is provided, based on the amount of change in the sensing signals RX1 and RX2.

Figure 8:
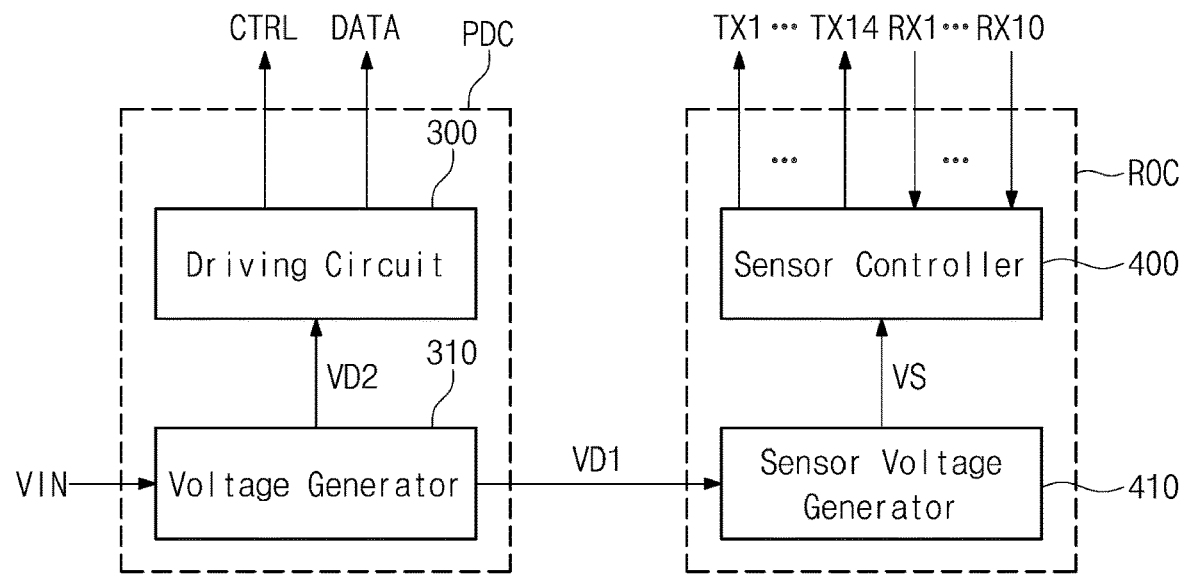
FIG. 8 is a block diagram illustrating a circuit configuration of a panel driving circuit and a readout circuit.

FIG. 8 is a block diagram illustrating a circuit configuration of a panel driving circuit and a readout circuit.

Referring to FIG. 8, the panel driving circuit PDC includes a driving circuit 300 and a voltage generator 310.

The driving circuit 300 may output a control signal CTRL to be provided to the scan driving circuit SDC through the control signal line CSL of the display panel DP (refer to FIG. 5) and a data signal DATA to be provided to the data lines DL. In an embodiment, the driving circuit 300 may output the control signal CTRL and the data signal DATA depending on signals provided from a host (or an application processor ("AP")) (not illustrated).

The voltage generator 310 may receive an input voltage VIN from the outside and may generate voltages for an operation of the panel driving circuit PDC. The voltage generator 310 may generate a first driving voltage VD1 for an operation of the readout circuit ROC. The voltage generator 310 may generate second driving voltages VD2 to be provided to the driving circuit 300 in the panel driving circuit PDC. The second driving voltages VD2 may include a plurality of voltages. In an embodiment, the second driving voltages VD2 may include a gate high voltage corresponding to a high level of a clock signal to be provided to the scan driving circuit SDC (refer to FIG. 5) and a gate low voltage corresponding to a low level of the clock signal. Moreover, the voltage generator 310 may further output voltages to be provided to the pixels PX of the display panel DP illustrated in FIG. 5.

Although not illustrated in FIG. 8, the input voltage VIN may be a voltage supplied from an external power supply device or a battery. In another embodiment, although not illustrated in FIG. 8, the input voltage VIN may be a voltage supplied from a voltage generator such as a DC-DC converter or a power management integrated circuit (PMIC), which is provided in the printed circuit board FCB.

The readout circuit ROC includes a sensor controller 400 and a sensor voltage generator 410. The sensor controller 400 may output transmit signals TX1 to TX14 to be provided to the first sensing electrodes SA1 to SA14 illustrated in FIG. 6, respectively, and may receive sensing signals RX1 to RX10 from the second sensing electrodes SB1 to SB10, respectively.

The sensor voltage generator 410 receives the first driving voltage VD1 from the panel driving circuit PDC and generates a sensor voltage VS used for an operation of the readout circuit ROC. In an embodiment, the sensor voltage VS may be a voltage used for the sensor controller 400 to generate the transmit signals TX1 to TX14.

Each of the transmit signals TX1 to TX14 may be a signal of a pulse wave that swings between a high voltage and a low voltage. In an embodiment, the high voltage of each of the transmit signals TX1 to TX14 may be a high voltage of 12 voltages (V).

The sensor voltage generator 410 may receive a voltage supplied from a voltage generator (not illustrated) such as a DC-DC converter or a PMIC, which is provided on the printed circuit board FCB. When a voltage supplied by the voltage generator provided on the printed circuit board FCB is a low voltage of 1.7 V, 3.3 V, or the like, the sensor voltage generator 410 may need to include two or more charge pumps to generate a high voltage of 12 V.

In an embodiment, the sensor voltage generator 410 may include a first charge pump and a second charge pump. The first charge pump may receive a voltage of 3.3 V from the voltage generator provided on the printed circuit board FCB and may output an output voltage of 5.5 V. The second charge pump may receive the voltage of 5.5 V output from the first charge pump and may generate a high voltage of 12 V.

Herein, power consumption of the first charge pump may be about 300 microwatts (μW), and power consumption of the second charge pump may be 970 μW. The total power consumption of the sensor voltage generator 410 including two charge pumps may be a total of 1270 μW.

In an embodiment, the sensor voltage generator 410 receives the first driving voltage VD1 generated by the voltage generator 310 in the panel driving circuit PDC. The first driving voltage VD1 output from the voltage generator 310 may have a voltage level higher than a voltage level of the input voltage VIN. In an embodiment, the first driving voltage VD1 may be 6 V.

As described above, the voltage generator 310 may include a regulator and/or a charge pump that generates a gate high voltage corresponding to a high level of a clock signal to be provided to the scan driving circuit SDC (refer to FIG. 5). Accordingly, the voltage generator 310 may not need a separate charge pump that generates the first driving voltage VD1, and may output one of the second driving voltages VD2 as the first driving voltage VD1. In this case, the first driving voltage VD1 may have the same voltage level as one of the second driving voltages VD2.

In an embodiment, the voltage generator 310 may generate the first driving voltage VD1 having a voltage level suitable for the sensor voltage generator 410 by using one of the second driving voltages VD2. In an embodiment, the first driving voltage VD1 may have a voltage level lower than one of the second driving voltages VD2.

Figure 9:
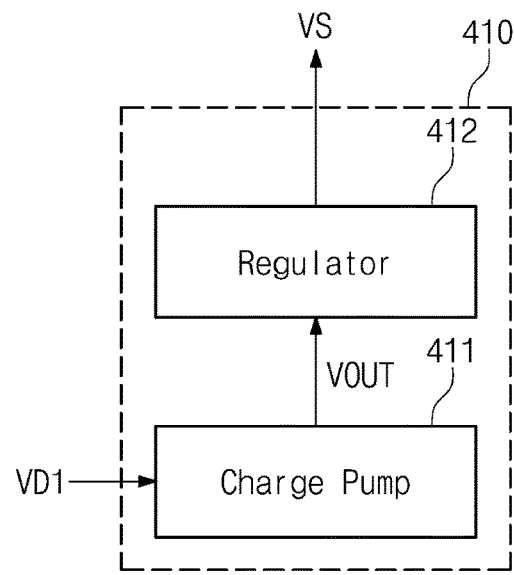
FIG. 9 is a block diagram illustrating a circuit configuration of a sensor voltage generator.

FIG. 9 is a block diagram illustrating a circuit configuration of the sensor voltage generator 410.

Referring to FIG. 9, the sensor voltage generator 410 includes a charge pump 411 and a regulator 412. The charge pump 411 increases a voltage level of the first driving voltage VD1 and outputs an output voltage VOUT. Accordingly, the output voltage VOUT output from the charge pump 411 has a voltage level higher than the first driving voltage VD1.

The regulator 412 receives the output voltage VOUT from the charge pump 411 and outputs the sensor voltage VS. Even though a load current is changed, the regulator 412 may uniformly maintain a voltage level of the sensor voltage VS. In an embodiment, the regulator 412 may be implemented with a low dropout ("LDO") regulator. Because the LDO regulator has low power consumption and low voltage drop, the LDO regulator is suitable as a linear regulator of a portable electronic device.

As illustrated in FIG. 9, the sensor voltage generator 410 generates the sensor voltage VS by using the first driving voltage VD1 output from the voltage generator 310 in the panel driving circuit PDC illustrated in FIG. 8, and thus there is a need for only the single charge pump 411. Accordingly, power consumption of the display device DD (refer to FIG. 1) may be minimized.

Figure 10:
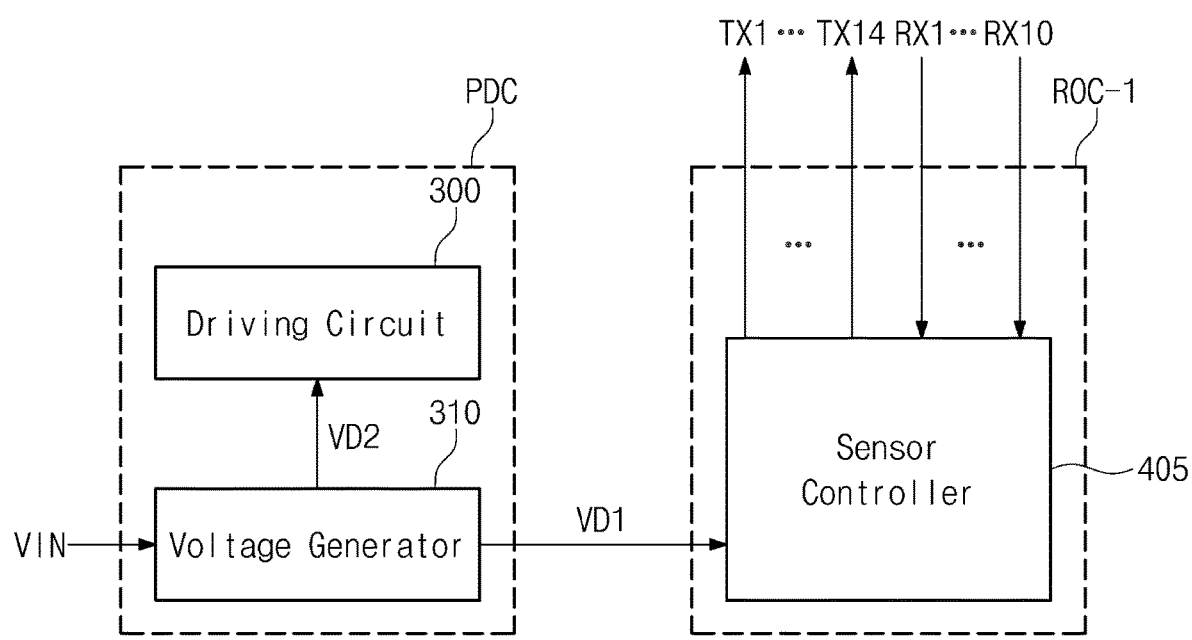
FIG. 10 is a block diagram illustrating a circuit configuration of a panel driving circuit and a readout circuit according to another embodiment of the present disclosure.

FIG. 10 is a block diagram illustrating a circuit configuration of a panel driving circuit and a readout circuit according to an embodiment of the present disclosure.

Referring to FIG. 10, the panel driving circuit PDC includes the driving circuit 300 and the voltage generator 310. The driving circuit 300 and the voltage generator 310 illustrated in FIG. 10 have the same circuit configuration as the driving circuit 300 and the voltage generator 310 illustrated in FIG. 8 and operate in the same manner as the driving circuit 300 and the voltage generator 310 illustrated in FIG. 8, respectively. Accordingly, the same reference numerals/marks are marked, and a redundant description is omitted.

A readout circuit ROC-1 includes a sensor controller 405. The sensor controller 405 may receive the first driving voltage VD1 from the panel driving circuit PDC, may output the transmit signals TX1 to TX14 to be respectively provided to the first sensing electrodes SA1 to SA14 illustrated in FIG. 6, and may receive the sensing signals RX1 to RX10 from the second sensing electrodes SB1 to SB10, respectively.

Because the readout circuit ROC-1 illustrated in FIG. 10 does not include a charge pump, the sensor controller 405 receives the first driving voltage VD1 from the panel driving circuit PDC.

As described above, each of the transmit signals TX1 to TX14 may be a signal in a form of a pulse wave that swings between a high voltage and a low voltage. When a high voltage of each of the transmit signals TX1 to TX14 is, for example, 6 V, the readout circuit ROC-1 may not need a separate charge pump.

In this case, the sensor controller 405 in the readout circuit ROC-1 may directly receive the first driving voltage VD1 from the panel driving circuit PDC. The readout circuit ROC-1 does not include a charge pump, thereby minimizing power consumption as compared to a case that a readout circuit has one or two charge pumps.

A readout circuit of a display device having the above-described configuration may generate a sensor voltage by using a driving voltage generated by a panel driving circuit. The readout circuit may minimize the number of charge pumps to generate the sensor voltage. Accordingly, a circuit configuration of the readout circuit may be simple, and power consumption of the readout circuit may be reduced.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:
1. A display device comprising:
a display panel;
an input sensor disposed on the display panel;
a panel driving circuit which drives the display panel and generates a first driving voltage; and
a readout circuit which controls the input sensor,
wherein the readout circuit receives the first driving voltage from the panel driving circuit and outputs transmit signals to control the input sensor,
wherein the panel driving circuit includes:

a voltage generator which receives an input voltage and generates the first driving voltage and a second driving voltage, wherein the second driving voltage is used for an operation of a driving circuit which outputs a control signal and an image data signal to the display panel.

2. The display device of claim 1, wherein the readout circuit includes:
a sensor controller which outputs the transmit signals; and
a sensor voltage generator which receives the first driving voltage and generates a sensor voltage for an operation of the sensor controller.

3. The display device of claim 2, wherein the first driving voltage has a voltage level higher than the input voltage.

4. The display device of claim 3, wherein the sensor voltage generator includes:
a charge pump which receives the first driving voltage and generates an output voltage having a voltage level higher than the first driving voltage; and
a regulator which receives the output voltage of the charge pump and outputs the sensor voltage.

5. The display device of claim 4, wherein the first driving voltage is about 6 voltages (V), and
wherein the sensor voltage is about 12 V.

6. The display device of claim 4, wherein the regulator is a low dropout (LDO) regulator.

7. The display device of claim 1, wherein the readout circuit includes:
a sensor controller which outputs the transmit signals based on the first driving voltage.

8. The display device of claim 1, wherein the input sensor is directly disposed on the display panel, and
wherein the input sensor includes:
first sensing electrodes;
second sensing electrodes crossing the first sensing electrodes;
first signal lines connected to the first sensing electrodes, respectively; and
second signal lines connected to the second sensing electrodes, respectively.

9. The display device of claim 8, wherein the readout circuit outputs the transmit signals to the first signal lines and receives sensing signals from the second signal lines.

10. A display device comprising:
a display layer;
an input layer disposed on the display layer;
a panel driving circuit electrically connected to the display layer; and
a readout circuit electrically connected to the input layer,
wherein the panel driving circuit includes a voltage generator which receives an input voltage and generates a first driving voltage and a second driving voltage,
wherein the second driving voltage is to be provided to the display layer,
wherein the readout circuit receives the first driving voltage from the voltage generator and outputs transmit signals to be provided to the input layer, and
wherein the first driving voltage has a voltage level higher than the input voltage.

11. The display device of claim 10, wherein the panel driving circuit further includes:
a driving circuit which receives the second driving voltage and controls the display layer.

12. The display device of claim 10, wherein the readout circuit includes:
a sensor voltage generator which receives the first driving voltage and generates a sensor voltage; and
a sensor controller which receives the sensor voltage and outputs the transmit signals.

13. The display device of claim 12, wherein the sensor voltage generator includes:
a charge pump which receives the first driving voltage and generates an output voltage having a voltage level higher than the first driving voltage; and
a regulator which receives the output voltage of the charge pump and outputs the sensor voltage.

14. The display device of claim 13, wherein the first driving voltage is about 6 V, and
wherein the sensor voltage is about 12 V.

15. The display device of claim 13, wherein the regulator is an LDO regulator.

16. The display device of claim 10, wherein the readout circuit includes:
a sensor controller which outputs the transmit signals based on the first driving voltage.

17. The display device of claim 10, wherein the input layer is directly disposed on the display layer, and
wherein the input layer includes:
first sensing electrodes;
second sensing electrodes crossing the first sensing electrodes;
first signal lines connected to the first sensing electrodes, respectively; and
second signal lines connected to the second sensing electrodes, respectively.

18. The display device of claim 17, wherein the readout circuit outputs the transmit signals to the first signal lines and receives sensing signals from the second signal lines.

* * * * *